(12) United States Patent
Jie

(10) Patent No.: US 8,153,486 B2
(45) Date of Patent: Apr. 10, 2012

(54) METHOD FOR FABRICATING CAPACITOR

(75) Inventor: Seok-Ho Jie, Gyeonngi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 55 days.

(21) Appl. No.: 12/612,908

(22) Filed: Nov. 5, 2009

(65) Prior Publication Data

US 2010/0325853 A1  Dec. 30, 2010

(30) Foreign Application Priority Data

Jun. 30, 2009  (KR) ........................ 10-2009-0059000

(51) Int. Cl.
  *H01L 21/00*  (2006.01)
(52) U.S. Cl. ........................................ 438/254; 438/397
(58) Field of Classification Search .......... 438/239–256, 438/396–399
  See application file for complete search history.

(56) References Cited

U.S. PATENT DOCUMENTS

| | | | | |
|---|---|---|---|---|
| 6,214,688 | B1 * | 4/2001 | Hwang et al. | 438/396 |
| 6,821,846 | B2 * | 11/2004 | Shao et al. | 438/253 |
| 2006/0183301 | A1 * | 8/2006 | Yeom et al. | 438/478 |
| 2009/0148625 | A1 * | 6/2009 | Yeom et al. | 427/576 |

FOREIGN PATENT DOCUMENTS

| | | |
|---|---|---|
| KR | 1020020073942 | 9/2002 |
| KR | 1020050059697 | 6/2005 |
| KR | 1020080088276 | 10/2008 |
| KR | 1020090043325 | 5/2009 |

OTHER PUBLICATIONS

Notice of Allowance issued from Korean Intellectual Property Office on Feb. 10, 2011.

* cited by examiner

*Primary Examiner* — Richard A. Booth
(74) *Attorney, Agent, or Firm* — IP & T Group LLP

(57) ABSTRACT

A method for fabricating a capacitor includes forming an etch stop layer, a first isolating insulation layer, and a floating layer over a substrate including storage node contact plugs to form a resulting substrate structure; etching the floating layer, the first isolating insulation layer, and the etch stop layer to form a plurality of open regions; forming a conductive layer over the substrate structure; forming a second isolating insulation layer over the conductive layer, the second isolating insulation layer filling upper portions of the open regions; etching portions of the remaining floating layer to form a floating pattern; performing a storage node isolation process in a manner that the floating pattern is exposed to form a plurality of storage nodes having sidewalls supported by the floating pattern; and removing the etched first isolating insulation layer.

13 Claims, 10 Drawing Sheets

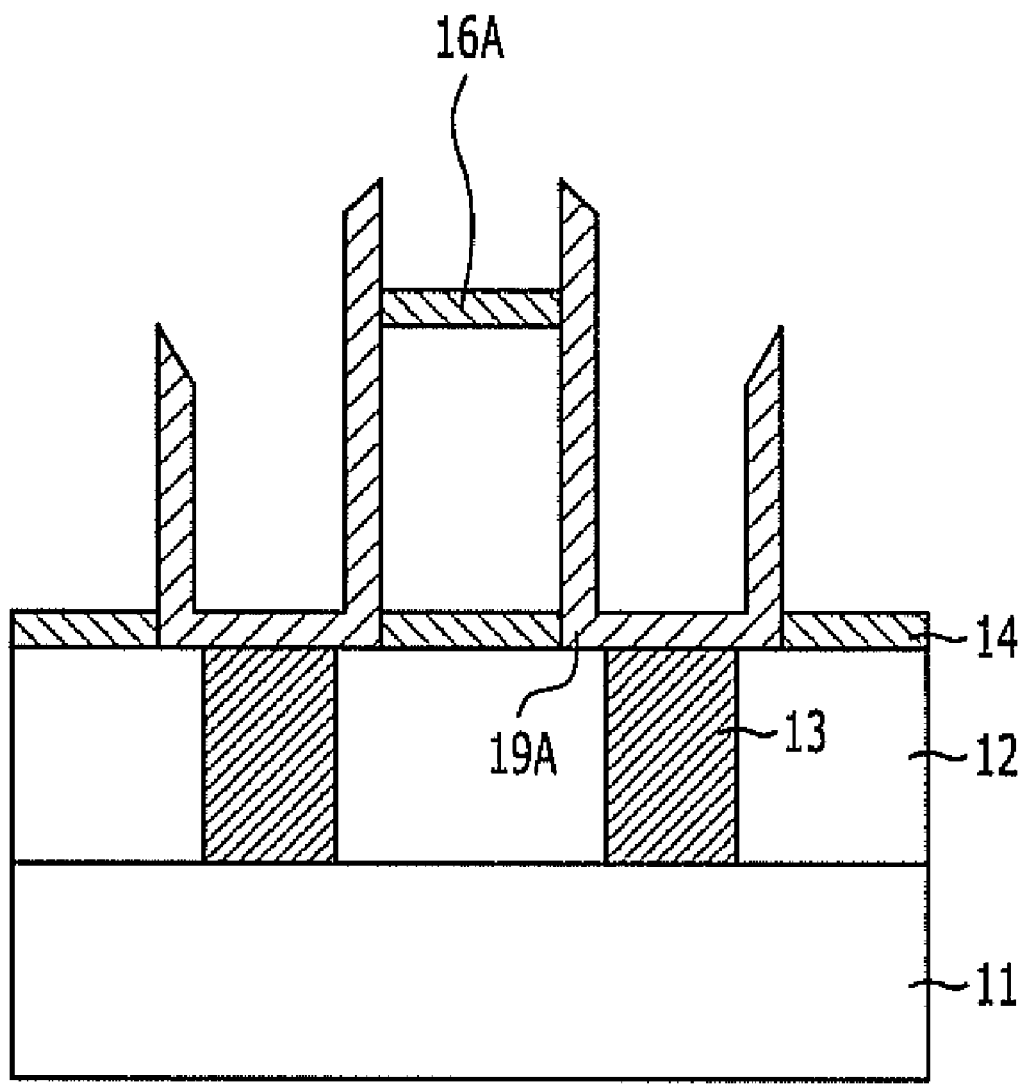

METHOD FOR FABRICATING CAPACITOR

CROSS-REFERENCE TO RELATED APPLICATION

The present application claims priority of Korean Patent Application No. 10-2009-0059000, filed on Jun. 30, 2009, which is incorporated herein by reference in its entirety.

BACKGROUND OF THE INVENTION

Exemplary embodiments of the present invention relate to a method for fabricating a semiconductor device, and more particularly, to a method for fabricating a capacitor.

Due to miniaturization of semiconductor memory devices, the area occupied by a capacitor has been reduced due to the decreasing size of a cell. Furthermore, technology to secure a high capacity capacitor is being developed to obtain a capacitor having high capacity for operating a semiconductor device.

Methods for obtaining a high capacity capacitor include expanding the surface area of storage nodes and applying a high-k dielectric layer. There are limitations as to stability and reliability in using a high-k dielectric layer with the existing process. Thus, applying a high-k dielectric layer may not be suitable for a semiconductor device manufacturing process. Therefore, expanding the surface area of storage nodes is more desirable.

Capacitor structures for expanding the surface area of storage nodes include stack structure, concave type, pin type, and cylinder type.

Recently, a cylinder type capacitor that uses a supporter has emerged as a type of a capacitor structure that maximizes the surface area of storage nodes. The supporter is a stabilizing structure which prevents slanting of storage nodes caused by surface tension generated during a subsequent dip out process. A material used as a supporter may also be referred to as a floating layer.

The capacitor having storage nodes fixed by a floating layer may increase capacitance by lengthening the vertical height of the capacitor, and thus expanding the surface area of the storage nodes. Also, the capacitor is a stabilizing structure which prevents slanting of the storage nodes caused by surface tension generated during a subsequent dip out process.

FIGS. 1A to 1E illustrate cross-sectional views of a typical method for fabricating a capacitor.

Referring to FIG. 1A, storage node contact plugs 13 are formed over a substrate 11, and buried in an inter-layer insulation layer 12. An etch stop layer is formed over the storage node contact plugs 13, and a first isolating insulation layer is formed over the etch stop layer. A floating layer is formed over the first isolating insulation layer. The floating layer is formed for use as a supporter. A second isolating insulation layer is formed over the floating layer.

A storage node etching process is performed on a substrate structure to form open regions 18 and exposing surfaces of the storage node contact plugs 13. As a result, etch stop patterns 14, first isolating insulation patterns 15, etched floating layers 16, and second isolating insulation patterns 17 are formed.

Referring to FIG. 1B, a conductive layer is formed over the surface profile of the open regions 18A. A storage node isolation process is performed to form storage nodes 19 having a cylinder form.

Referring to FIG. 1C, a third isolating insulation layer 20 is formed to fill upper portions of open regions 18A formed by the storage nodes 19. A floating capacitor mask 21 is formed over the third isolating insulation layer 20. If the etched floating layers 16 include nitride, the floating capacitor mask 21 may be referred to as a nitride floating capacitor mask.

Referring to FIG. 1D, the third isolating insulation layer 20, the second isolating insulation patterns 17, and the etched floating layers 16 are etched using the floating capacitor mask 21 as an etch barrier. At this time, portions of the storage nodes 19 are also etched. Consequently, a floating pattern 16A is formed to fix adjacent storage nodes 19.

Remaining portions of the second isolating insulation patterns 17, the storage nodes 19, and the third isolating insulation layer 20 are referred to as a remaining second isolating insulation pattern 17A, remaining storage nodes 19A, and a remaining third isolating insulation layer 20A, respectively.

Referring to FIG. 1E, a wet dip out process is performed to remove the first isolating insulation patterns 15 in FIG. 1D. At this time, the remaining third isolating insulation layer 20A and the remaining second isolating insulation pattern 17A are removed at substantially the same time.

However, upper portions of the storage nodes 19 are formed in a sharp shape during the storage node isolation process according to this typical method, as represented by reference denotation 'A' shown in FIG. 1B. Such sharp shape is a primary cause of breaking after the subsequent wet dip out process is performed.

Furthermore, after the etched floating layers 16 are etched using this typical method, there is a height difference between portions of the remaining storage nodes 19A formed where the floating pattern 16A remains and other portions of the remaining storage nodes 19A formed where the etched floating layers 16 are etched away, as represented by reference denotation 'B' shown in FIG. 1D.

Moreover, the sharp upper portions of the storage nodes 19 are further etched during the etching of the etched floating layers 16, resulting in even sharper upper portions, as represented by reference denotation 'C' shown in FIG. 1D. Thus, the remaining storage nodes 19A become more likely to break.

FIG. 2A illustrates a micrographic view showing sharp portions of typical storage nodes, as represented by reference denotation 22. FIG. 2B illustrates a micrographic view showing losses of upper portions of typical storage nodes occurred while etching a floating layer, as represented by reference denotation 23. FIG. 2C illustrates micrographic views showing secondary contamination caused by lost pieces of typical storage nodes, as represented by reference denotation 24.

SUMMARY OF THE INVENTION

An embodiment of the present invention is directed to providing a method for fabricating a capacitor, which can minimize losses of upper portions of storage nodes during a process for fabricating a capacitor using a floating layer.

In accordance with an aspect of the present invention, a method for fabricating a capacitor includes: forming an etch stop layer, a first isolating insulation layer, and a floating layer over a substrate including storage node contact plugs to form a resulting substrate structure; etching the floating layer, the first isolating insulation layer, and the etch stop layer to form a plurality of open regions; forming a conductive layer over the substrate structure; forming a second isolating insulation layer over the conductive layer, the second isolating insulation layer filling upper portions of the open regions; etching portions of the remaining floating layer to form a floating pattern; performing a storage node isolation process in a manner that the floating pattern is exposed to form a plurality of storage nodes having sidewalls supported by the floating pattern; and removing the etched first isolating insulation layer.

In accordance with another aspect of the present invention, the etching of the remaining floating layer to form the floating pattern may include: forming a mask for forming the floating pattern over the second isolating insulation layer; etching the second isolating insulation layer using the mask; and etching portions of the remaining floating layer using the mask.

In accordance with another aspect of the present invention, the floating pattern may include a nitride-based layer.

In accordance with another aspect of the present invention, the nitride-based layer may include one of a silicon nitride layer and a silicon oxynitride (SiON) layer.

In accordance with another aspect of the present invention, the nitride-based layer may include one of a silicon nitride layer and a silicon oxynitride (SiON) layer.

In accordance with another aspect of the present invention, the floating pattern may support four or more adjacent storage nodes at substantially the same time.

In accordance with another aspect of the present invention, the first and second isolating insulation layers may include an oxide-based layer and the floating pattern may include a nitride-based layer.

In accordance with another aspect of the present invention, the removing of the etched first isolating insulation layer may include performing a wet dip out process.

In accordance with another aspect of the present invention, the storage node isolation process may include using a chemical mechanical polishing (CMP) process.

BRIEF DESCRIPTION OF THE DRAWINGS

FIGS. 1A to 1E illustrate cross-sectional views of a typical method for fabricating a semiconductor device having a nitride floating capacitor.

DESCRIPTION OF SPECIFIC EMBODIMENTS

Figure 1A:
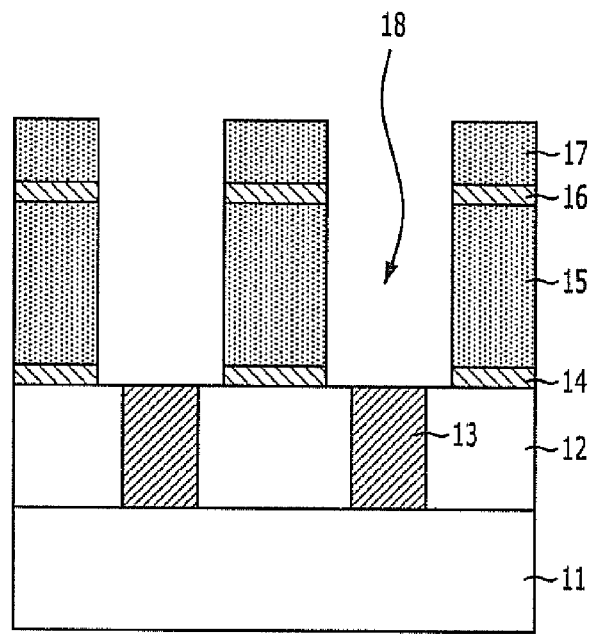
Figure 1B:
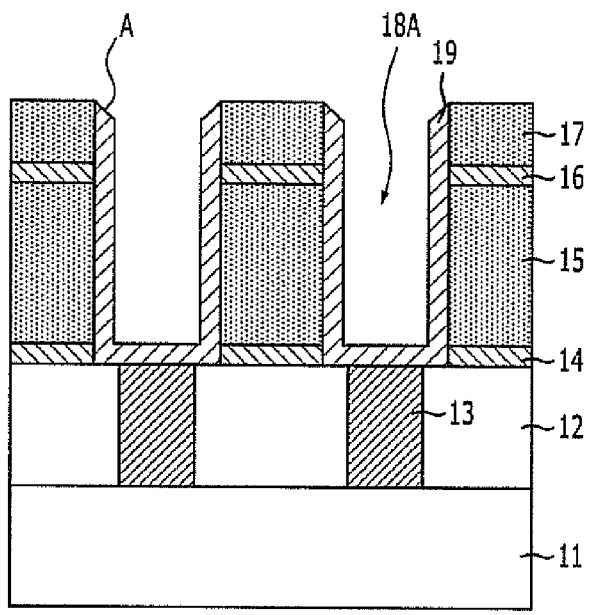
Figure 1C:
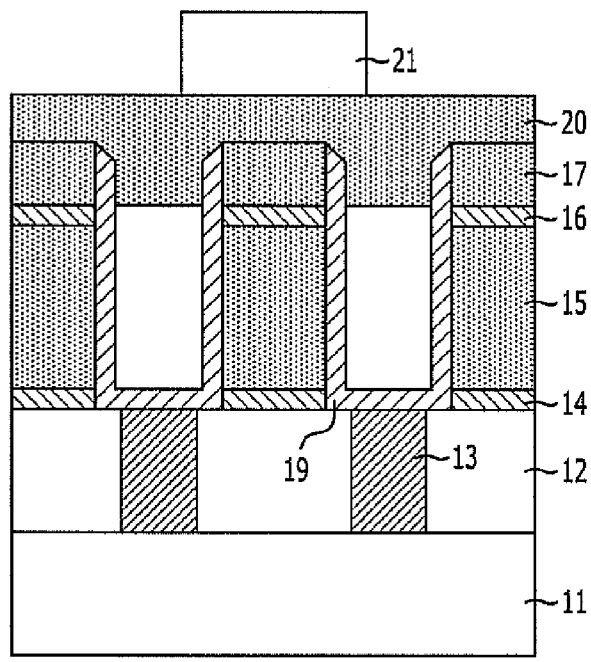
Figure 1D:
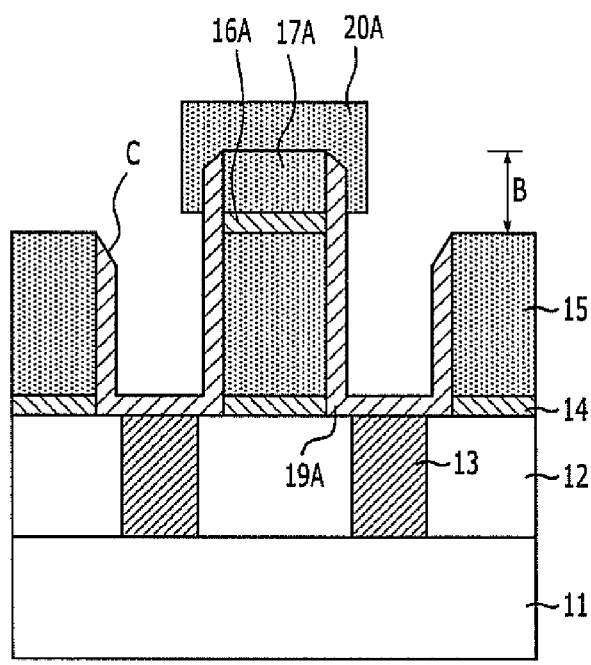
Figure 2A:
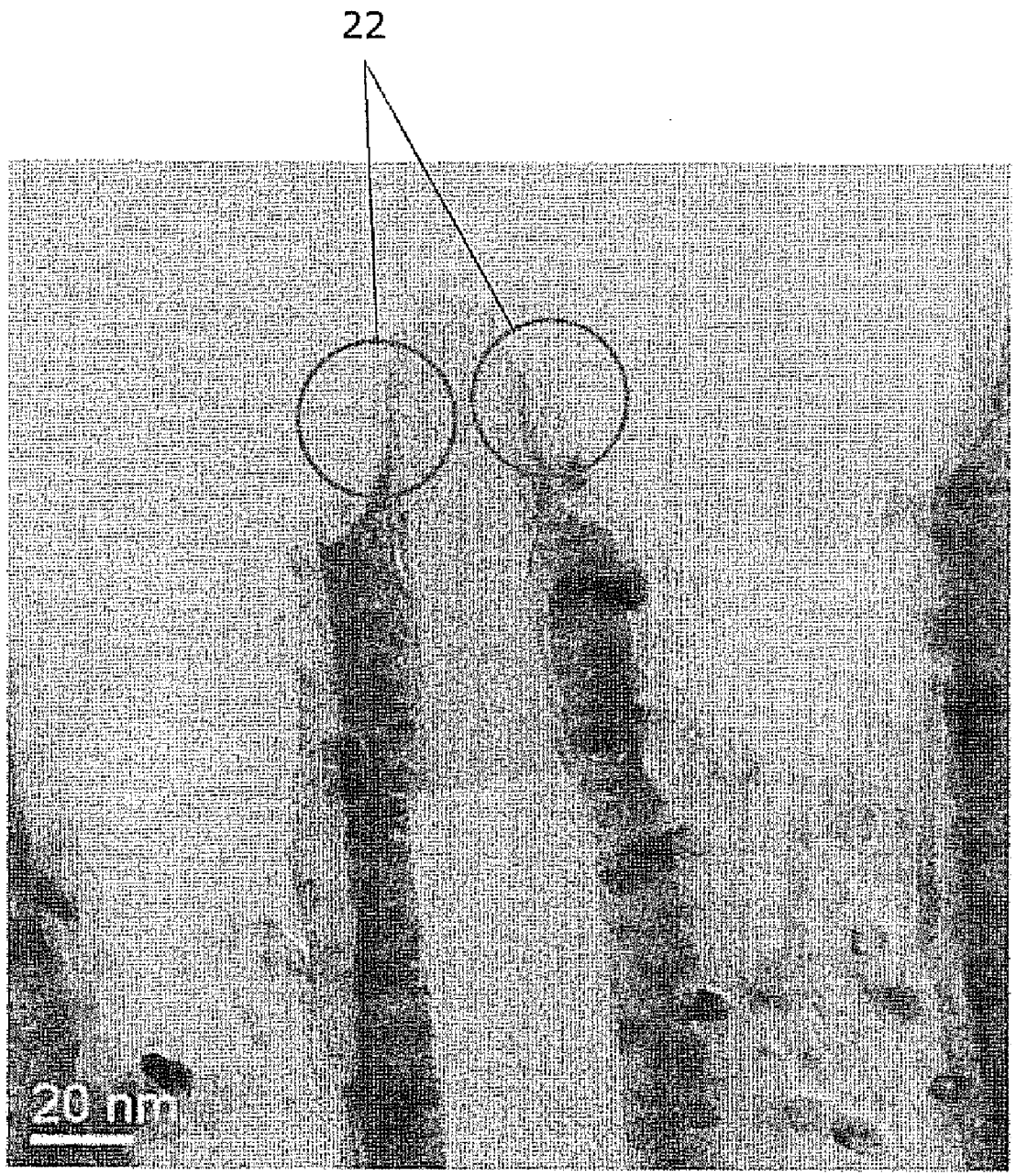
FIG. 2A illustrates a micrographic view showing sharp portions of typical storage nodes.
Figure 2B:
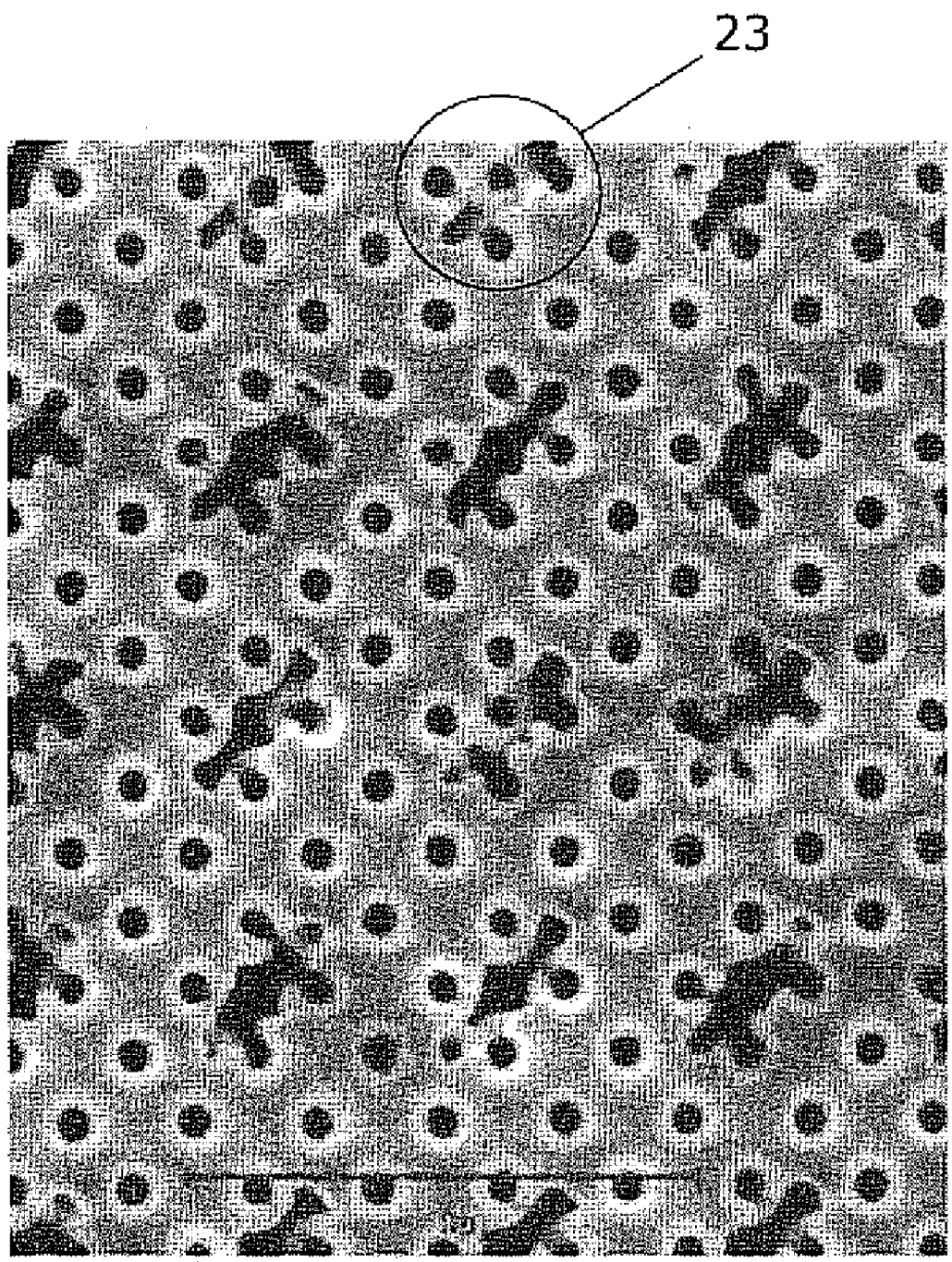
FIG. 2B illustrates a micrographic view showing losses of upper portions of typical storage nodes occurred while etching a nitride-based layer.
Figure 2C:
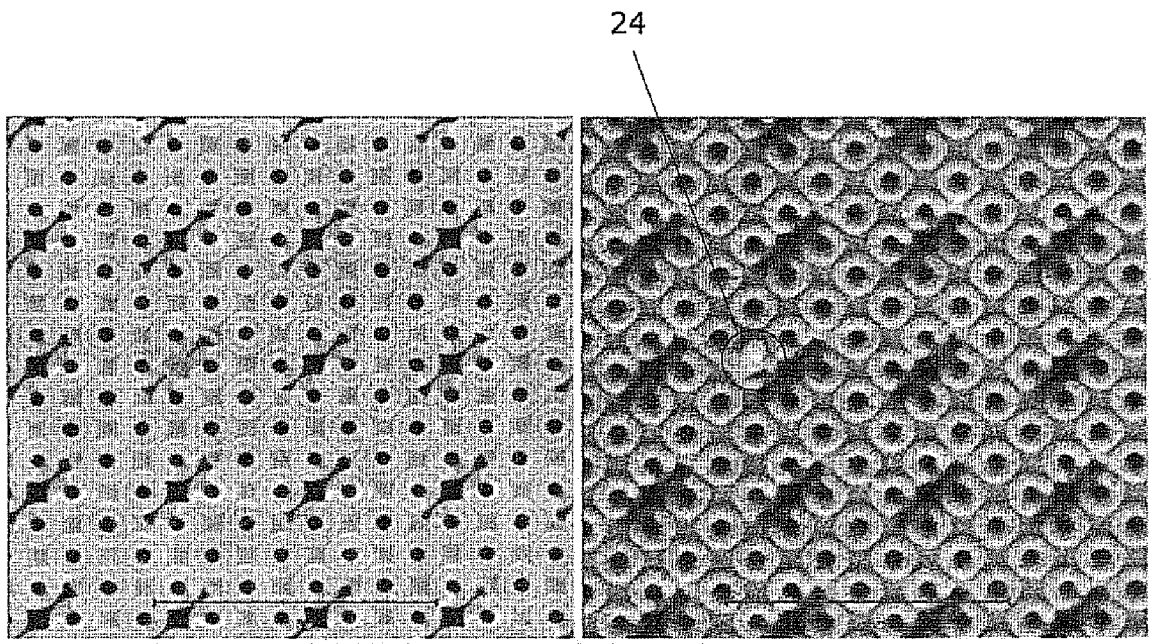
FIG. 2C illustrates micrographic views showing secondary contamination caused by lost pieces of typical storage nodes.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on (or over) the second layer or the substrate, or it could also mean that a third layer may exist between the first layer and the substrate. Furthermore, the same or like reference numerals represent the same or like constituent elements, although they appear in different embodiments or drawings of the present invention.

FIGS. 3A to 3F illustrate cross-sectional views of a method for fabricating a capacitor, in accordance with an embodiment of the present invention.

Figure 3A:
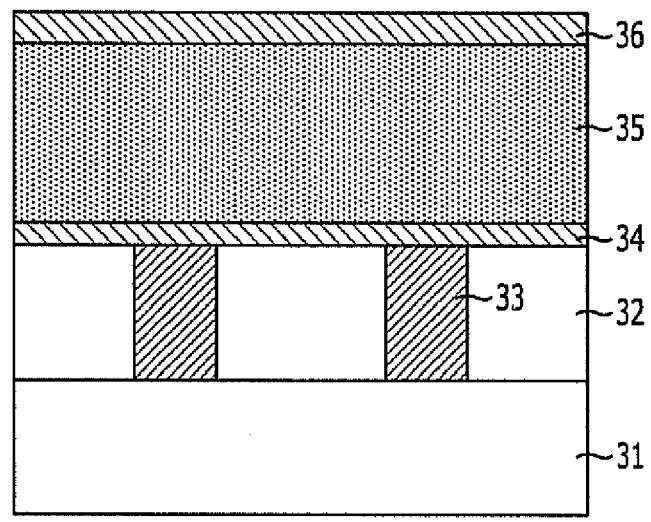
FIGS. 3A to 3F illustrate cross-sectional views of a method for fabricating a semiconductor device in accordance with an embodiment of the present invention.

Referring to FIG. 3A, an inter-layer insulation layer is formed over a substrate 31. Storage node contact holes are formed to pass through the inter-layer insulation layer. As a result, an inter-layer insulation pattern 32 is formed. Storage node contact plugs 33 are formed, buried over the storage node contact holes. Although not illustrated, processes for forming transistors including word lines and bit lines are generally performed before forming the inter-layer insulation pattern 32.

The inter-layer insulation pattern 32 includes an oxide-based layer. The storage node contact plugs 33 are formed by forming a polysilicon layer or a metallic conductive layer and performing an etch-back process.

Although not illustrated, a barrier metal may be formed over the storage node contact plugs 33. The barrier metal may include titanium (Ti) or titanium/titanium nitride (TiN).

An etch stop layer 34 is formed over the resulting substrate structure. The etch stop layer 34 is formed for use as an etch stop layer during an etching of a subsequent isolating insulation layer.

For instance, the etch stop layer 34 may include silicon nitride ($Si_3N_4$) or silicon oxynitride (SiON), and may be formed to a thickness ranging from approximately 500 Å to approximately 2,000 Å. Although not illustrated, a buffer oxide layer may be additionally formed over the etch stop layer 34.

A first isolating insulation layer 35 is formed over the etch stop layer 34. At this time, the first isolating insulation layer 35 includes an oxide-based layer formed to a thickness which can secure an area needed for a desired capacitance.

The first isolating insulation layer 35 may include an oxide-based layer such as borophosphosilicate glass (BPSG), phosphosilicate glass (PSG), tetraethyl orthosilicate (TEOS), undoped silicate glass (USG), high density plasma (HDP), or a combination thereof. The first isolating insulation layer 35 is formed to a thickness ranging from approximately 100 Å to approximately 15,000 Å.

After the first isolating insulation layer 35 is formed, a planarization process may be performed using a chemical mechanical polishing (CMP) process, a dry etching process, or a wet etching process. Therefore, a subsequent photo process may be performed with ease. At this time, a thickness removed by the planarization process may range from approximately 50 Å to approximately 5,000 Å.

A floating layer 36 is formed over the first isolating insulation layer 35 to function as a supporter. The floating layer 36 is formed to prevent storage nodes from slanting during a subsequent wet dip out process. The floating layer 36 includes a nitride-based layer. The floating layer 36 is formed to a thickness ranging from approximately 50 Å to approximately 3,000 Å. The nitride-based layer used as the floating layer 36 includes a silicon nitride layer or a silicon oxynitride (SiON) layer. A material used as a supporter may include an amorphous carbon layer.

When a floating layer used as a supporter includes a nitride-based layer, such structure is referred to as a nitride floating capacitor.

Figure 3B:
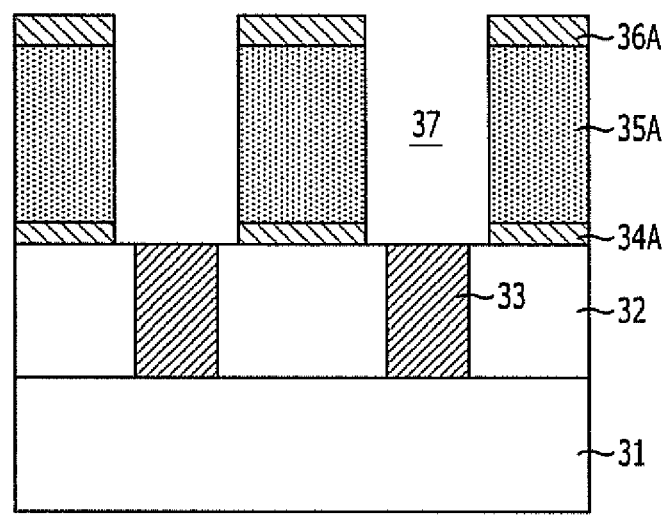

Referring to FIG. 3B, a storage node etching process is performed to form open regions 37 exposing surfaces of the storage node contact plugs 33. In detail, the storage node etching process includes etching the floating layer 36, the first isolating insulation layer 35, and the etch stop layer 34 using a storage node mask (not shown) formed with photoresist.

Before forming the storage node mask, a hard mask layer (not shown) such as an amorphous carbon layer or a polysilicon layer may be formed in advance, and an anti-reflective coating layer (not shown) may be formed over the hard mask layer. The anti-reflective coating layer may include a silicon oxynitride (SiON) layer.

In this embodiment of the present invention, the storage node etching process is performed without forming a typical second isolating insulation layer. By performing the storage node etching process after forming the floating layer 36 without forming the typical second isolating insulation layer, the height difference between portions of subsequent storage nodes may be minimized after the subsequent wet dip out process is performed.

Reference denotations 34A, 35A, and 36A represent an etch stop pattern 34A, a first isolating insulation pattern 35A, and an etched floating layer 36A, respectively.

Figure 3C:
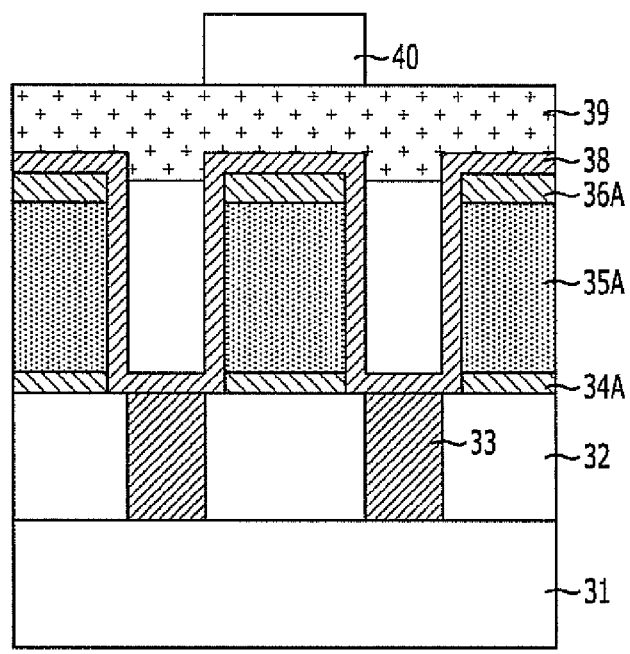

Referring to FIG. 3C, a storage node conductive layer 38 is formed over the surface profile of the open regions 37. The storage node conductive layer 38 for forming storage nodes includes one of a metallic nitride layer, a metal layer, and a combination thereof.

For instance, the storage node conductive layer 38 may include one of titanium (Ti), titanium nitride (TiN), ruthenium (Ru), tantalum nitride (TaN), tungsten nitride (WN), platinum (Pt), iridium (Ir), and a combination thereof. The storage node conductive layer 38 is formed to a thickness ranging from approximately 200 Å to approximately 900 Å using a chemical vapor deposition (CVD) method or an atomic layer deposition (ALD) method.

A second isolating insulation layer 39 is formed over the storage node conductive layer 38, filling upper regions of the open regions 37. A floating capacitor mask 40 is formed over the second isolating insulation layer 39.

The second isolating insulation layer 39 may include substantially the same material as the first isolating insulation pattern 35A. For instance, the second isolating insulation layer 39 may include an oxide-based layer such as BPSG, PSG, TEOS, USG, HDP, or a combination thereof. When forming the floating capacitor mask 40, i-line, krypton fluoride (KrF), argon fluoride (ArF), or ArF immersion may be used as a photo-exposure source.

Figure 3D:
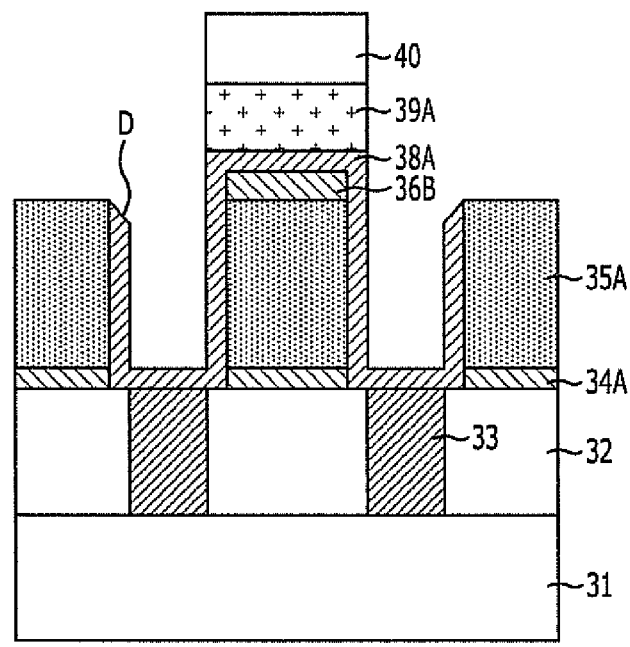

Referring to FIG. 3D, an etching process using the floating capacitor mask 40 is performed to etch the second isolating insulation layer 39 in FIG. 3C. Thus, a remaining second isolating insulation layer 39A is formed. The etching process continues to etch portions of the etched floating layer 36A except a portion of the etched floating layer 36A for use as a floating pattern. The floating pattern is represented by reference denotation 36B. If the etched floating layer 36A includes a nitride-based layer, a gas including one of $C_xF_y$, $C_xF_yCl_z$, oxygen ($O_2$), ozone ($O_3$), and a combination thereof may be used.

While forming the floating pattern 36B, portions of the storage node conductive layer 38 exposed by the floating capacitor mask 40 are also etched away. Thus, a remaining storage node conductive layer 38A having a sharp shape may be formed as represented by reference denotation 'D'.

However, the sharp shape is less sharp than one resulting from a typical floating layer etching. In a typical method, storage nodes first obtain a sharp shape during a storage node isolation process, and the sharp shape is further sharpened when the storage nodes are etched one more time during an etching of a floating layer. In this embodiment of the present invention, on the other hand, the sharp shape 'D' generated while etching the etched floating layer 36A is less sharp than that of the typical method because a storage node isolation process is not yet performed.

Figure 3E:
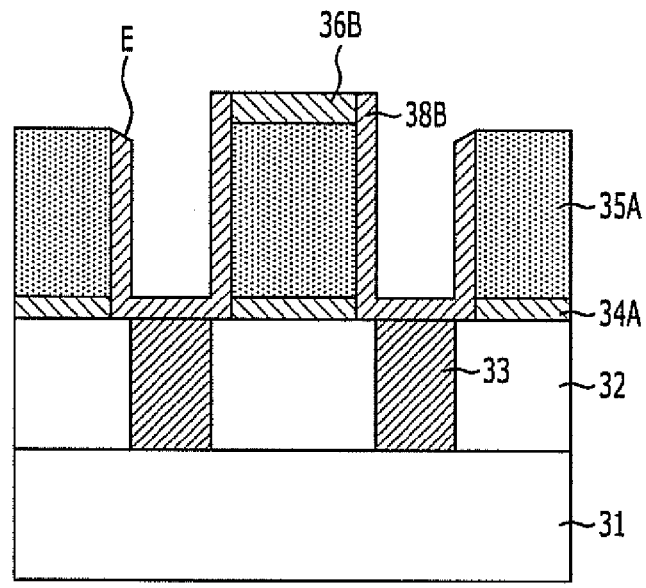

Referring to FIG. 3E, the floating capacitor mask 40 in FIG. 3D is removed and a storage node isolation process is performed. At this time, the storage node isolation process polishes the remaining storage node conductive layer 38A using a CMP process. The remaining second isolating insulation layer 39A is also removed during the storage node isolation process. During the CMP process, the floating pattern 36B functions as a polish stop layer, and the degree of sharpness in the sharp shape is lessened because of the CMP process, as represented by reference denotation 'E'.

Meanwhile, an etch-back process may be performed as the storage node isolation process. However, performing the etch-back process may cause the sharp shape to become even sharper when compared to the CMP process. Thus, it is more desirable to use the CMP process as the storage node isolation process.

Storage nodes 38B having a cylinder shape are formed by the storage node isolation process. The floating pattern 36B is formed between adjacent storage nodes 38B.

Figure 3F:
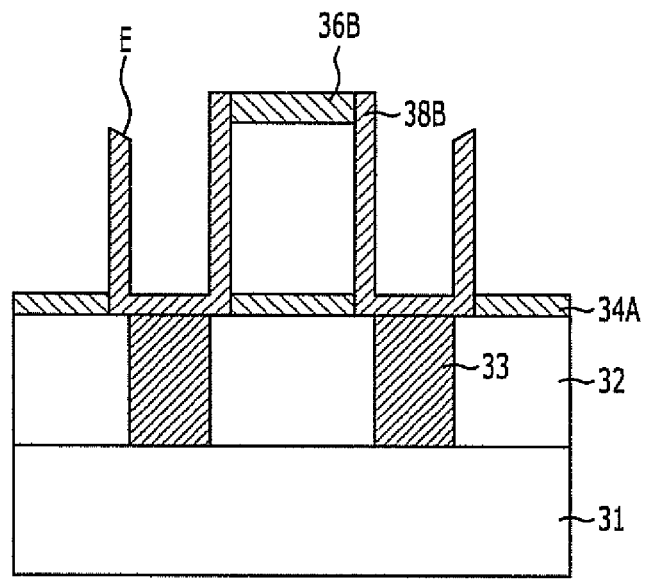

Referring to FIG. 3F, the first isolating insulation pattern 35A is removed using a wet dip out process. The wet dip out process may use a wet chemical such as hydrogen fluoride or buffered oxide etchant (BOE) solution because the first isolating insulation pattern 35A includes an oxide-based layer.

The floating pattern 36B is not etched away during the wet dip out process. Instead, the floating pattern 36B remains to hold the storage nodes 38B in their places, and as a result, the storage nodes 38B does not slant. The wet chemical may not be able to penetrate into bottom structures of the substrate structure because of the etch stop pattern 34A, which includes a nitride-based layer.

The storage nodes 38B are floated by the floating pattern 36B. This type of structure is referred to as a floating capacitor. If the floating pattern 36B includes a nitride-based layer, then such structure is referred to as a nitride floating capacitor.

Figure 4A:
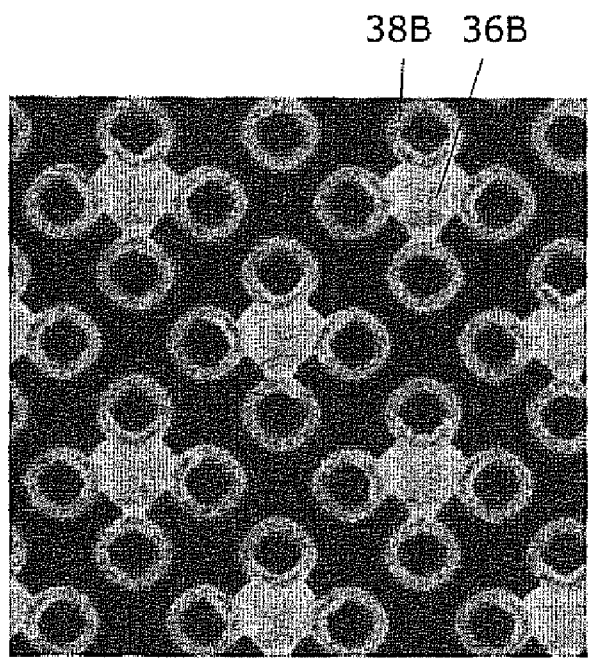
FIGS. 4A and 4B illustrate micrographic views of floating patterns in accordance with the embodiment of the present invention.
Figure 4B:
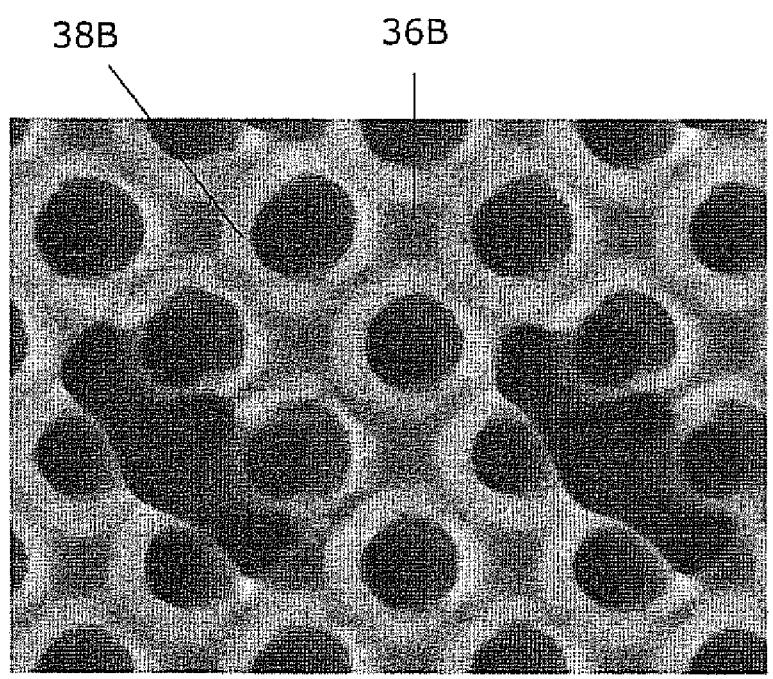

FIGS. 4A and 4B illustrate micrographic views of floating patterns in accordance with the embodiment of the present invention.

When performing the wet dip out process, a chemical having a large selectivity with respect to oxide is used to mainly remove the first isolating insulation pattern 35A including oxide and minimize losses of the floating pattern 36B.

Furthermore, a notch aligning may be performed before the wet dip out process to minimize slanting and breaking of the storage nodes 38B.

An organic material removing chemical and an oxide removing chemical may be selectively used in-situ or ex-situ to reduce generation of defects during the wet dip out process for removing the first isolating insulation pattern 35A.

In accordance with the embodiment of the present invention, losses of exposed upper portions of the storage nodes may be minimized when etching the floating layer functioning as a supporter. Thus, slanting and breaking of the storage nodes may be reduced, and lowering of the capacitance may be prevented.

Furthermore, the processes may be simplified because the typical second isolating insulation layer need not be formed.

In accordance with the embodiment of the present invention, the storage node isolation process is performed after the floating pattern functioning as a supporter is formed. Therefore, losses of upper portions of the storage nodes may be minimized.

Consequently, a lowering of capacitance may be prevented because particles may not be generated, slanting and breaking of the storage nodes may be prevented during the subsequent wet dip out process, and the losses of the upper portions of the storage nodes may be minimized.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor, comprising:
    forming a first isolating insulation layer and a floating layer over a substrate including storage node contact plugs to form a resulting substrate structure;
    etching the floating layer and the first isolating insulation layer to form a plurality of open regions;
    forming a conductive layer over the substrate structure;
    forming a second isolating insulation layer over the conductive layer, wherein the second isolating insulation layer fills upper portions of the open regions;
    etching portions of the remaining floating layer to form a floating pattern;
    performing a storage node isolation process after the forming of the floating pattern, wherein the performing of the storage node isolation process removes the conductive layer formed over the floating pattern; and
    removing the etched first isolating insulation layer.

2. The method of claim 1, wherein the etching of the remaining floating layer to form the floating pattern comprises:
    forming a mask for forming the floating pattern over the second isolating insulation layer;
    etching the second isolating insulation layer using the mask; and
    etching portions of the remaining floating layer using the mask.

3. The method of claim 2, wherein the floating pattern comprises a nitride-based layer.

4. The method of claim 3, wherein the nitride-based layer comprises one of a silicon nitride layer and a silicon oxynitride (SiON) layer.

5. The method of claim 1, wherein the floating pattern comprises a nitride-based layer.

6. The method of claim 5, wherein the nitride-based layer comprises one of a silicon nitride layer and a silicon oxynitride (SiON) layer.

7. The method of claim 1, wherein the floating pattern supports four or more adjacent storage nodes at substantially the same time.

8. The method of claim 1, wherein the first and second isolating insulation layers comprise an oxide-based layer and the floating pattern comprises a nitride-based layer.

9. The method of claim 8, wherein the removing of the etched first isolating insulation layer comprises performing a wet dip out process.

10. The method of claim 1, wherein the storage node isolation process comprises using a chemical mechanical polishing (CMP) process.

11. The method of claim 1, wherein the performing of the storage node isolation process includes forming the plurality of storage nodes to each have a cylinder form and the forming of the plurality of storage nodes to each have a cylinder form occurs after the formation of the floating pattern.

12. The method of claim 1, wherein the removing of the etched first isolating insulation layer occurs after the performing of the storage node isolation process.

13. The method of claim 1, wherein the performing of the storage node isolation process is performed so that the floating pattern is exposed to form a plurality of storage nodes having sidewalls supported by the floating pattern.

* * * * *